(12) United States Patent
Schedel et al.

(10) Patent No.: US 11,537,039 B2
(45) Date of Patent: Dec. 27, 2022

(54) PHOTOMASK ASSEMBLY WITH REFLECTIVE PHOTOMASK AND METHOD OF MANUFACTURING A REFLECTIVE PHOTOMASK

(71) Applicant: Advanced Mask Technology Center GmbH & Co. KG, Dresden (DE)

(72) Inventors: Thorsten Schedel, Dresden (DE); Markus Bender, Dresden (DE); Andreas Schenke, Langebrueck (DE)

(73) Assignee: ADVANCED MASK TECHNOLOGY CENTER GMBH & CO. KG, Dresden (DE)

(*) Notice: Subject to any disclaimer, the term of this patent is extended or adjusted under 35 U.S.C. 154(b) by 91 days.

(21) Appl. No.: 16/739,555

(22) Filed: Jan. 10, 2020

(65) Prior Publication Data
US 2020/0225571 A1 Jul. 16, 2020

(51) Int. Cl.
*G03F 1/24* (2012.01)
*G03F 1/48* (2012.01)
*G03F 1/52* (2012.01)
*G03F 1/60* (2012.01)

(52) U.S. Cl.
CPC .............. *G03F 1/24* (2013.01); *G03F 1/48* (2013.01); *G03F 1/52* (2013.01); *G03F 1/60* (2013.01)

(58) Field of Classification Search
CPC ...................................... G03F 1/22; G03F 1/24
See application file for complete search history.

(56) References Cited

U.S. PATENT DOCUMENTS

| | | | |
|---|---|---|---|
| 6,352,803 B1 | 3/2002 | Tong et al. | |
| 2004/0234870 A1* | 11/2004 | Aschke | B82Y 10/00 428/428 |
| 2013/0236818 A1* | 9/2013 | Lee | G03F 1/24 430/5 |
| 2013/0323626 A1* | 12/2013 | Chang | G03F 1/58 430/5 |
| 2013/0323928 A1* | 12/2013 | Tanaka | G03F 1/22 430/5 |
| 2014/0030639 A1* | 1/2014 | Lee | G03F 1/76 430/5 |

(Continued)

FOREIGN PATENT DOCUMENTS

DE 112012000658 T5 11/2013
JP 03-071134 * 3/1991

(Continued)

OTHER PUBLICATIONS

Machine translation of JP 2012-182235 (2012).*

(Continued)

*Primary Examiner* — Martin J Angebrannedt
(74) *Attorney, Agent, or Firm* — Murphy, Bilak & Homiller, PLLC

(57) ABSTRACT

A photomask mask assembly includes a reflective photomask and a protection structure. The reflective photomask includes a substrate and a reflective multilayer on a first substrate surface of the substrate at a front side of the reflective photomask. The protection structure is on a second substrate surface of the substrate at a backside of the reflective photomask, and is detachable from the reflective photomask at a temperature below 150 degree Celsius.

9 Claims, 7 Drawing Sheets

(56) References Cited

U.S. PATENT DOCUMENTS

2014/0234755 A1* 8/2014 Sasaki ..................... G03F 1/42
                                                                                                                    430/5
2016/0327862 A1* 11/2016 Tsuchimura ............ G03F 7/038
2017/0278710 A1* 9/2017 Moon ............... H01L 21/31138

FOREIGN PATENT DOCUMENTS

| JP | 2010-122304 | * | 6/2010 |
| JP | 2010-168474 | * | 8/2010 |
| JP | 2012-009537 | * | 1/2012 |
| JP | 2012-182235 | * | 9/2012 |
| JP | 2015-053473 | * | 3/2015 |
| JP | 2015-088510 | * | 5/2015 |

OTHER PUBLICATIONS

Machine translation of JP 2012-009537 (2012).*
Machine translation of JP 2010-168474 (2010).*
Machine translation of JP 2010-122304 (2010).*
Machine trnalation of JP 2015-088510 (2015).*

* cited by examiner

PHOTOMASK ASSEMBLY WITH REFLECTIVE PHOTOMASK AND METHOD OF MANUFACTURING A REFLECTIVE PHOTOMASK

TECHNICAL FIELD

The present disclosure is related to a photomask assembly with a reflective photomask, in particular, with an EUV (extreme ultraviolet) photomask and to a photomask assembly with a reflective mask blank. The present disclosure is further related to a method of manufacturing a reflective photomask.

BACKGROUND

EUVL (Extreme ultraviolet lithography) employs electromagnetic radiation at an exposure wavelength of about 13.5 nm and is a promising next generation lithography technology for high volume manufacturing of semiconductor devices at a resolution beyond what is achievable with 193 nm optical lithography. EUVL uses reflective optics and a reflective photomask with a multilayer mirror. Typically, an electrostatic chuck or a vacuum chuck holds the photomask in place during the exposure of semiconductor wafers. Defects on the backside of the photomask, for example, particles that are inadvertently trapped between the chuck and the backside surface of the photomask, may impact the planarity of the photomask at the front side, may result in unintentional image displacement and focus error, and may damage the chuck.

It is an object of the embodiments to reduce the frequency of occurrence of critical defects on the backside of photomasks or to mitigate them thoroughly.

SUMMARY

An embodiment of the present disclosure refers to a photomask assembly that includes a reflective photomask and a protection structure. The reflective photomask includes a substrate, a reflective multilayer on a first substrate surface of the substrate at a front side of the photomask. The protection structure on a second substrate surface of the substrate at the backside of the photomask is detachable from the photomask at a temperature below 150 degree Celsius.

Another embodiment of the present disclosure is related to a method of manufacturing a reflective photomask. The method includes forming a reflective photomask that includes a substrate, a reflective multilayer on a first substrate surface of the substrate, and an absorber pattern on the multilayer at a front side of the photomask. Before forming the absorber pattern, a protection structure is bonded on a second substrate surface of the substrate at a backside of the photomask.

A further embodiment of the present disclosure refers to another photomask assembly that includes a reflective photomask and a protection structure. The reflective photomask includes a substrate, a reflective multilayer on a first substrate surface of the substrate and an absorber pattern on the multilayer at a front side of the photomask. The protection structure on a second substrate surface of the substrate at the backside of the photomask is removable from the photomask at a temperature below 150 degree Celsius and/or by applying a process liquid inert to the absorber pattern.

A further embodiment of the present disclosure refers to another method of manufacturing a reflective photomask. A photomask is formed that includes a substrate and a reflective multilayer on a first substrate surface of the substrate at a front side of the photomask. Before forming an absorber pattern on the reflective multilayer, a protection structure is provided on a second substrate surface of the substrate at a backside of the photomask. After forming the absorber pattern, the protection structure is removed.

BRIEF DESCRIPTION OF THE DRAWINGS

The accompanying drawings are included to provide a further understanding of the embodiments and are incorporated in and constitute a part of this specification. The drawings illustrate the embodiments of the present disclosure and together with the description serve to explain principles of the embodiments. Other embodiments and intended advantages will be readily appreciated as they become better understood by reference to the following detailed description.

DETAILED DESCRIPTION

Figure 1A:
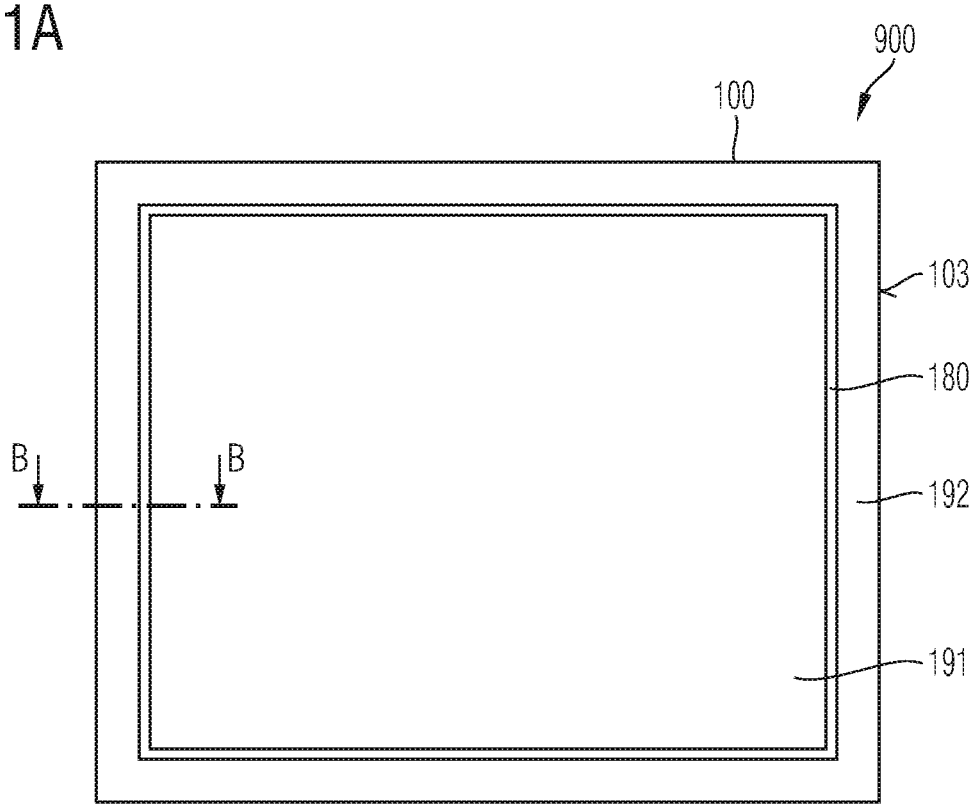
FIGS. 1A-1B illustrate a schematic plan view and a schematic vertical cross-sectional view of a photomask assembly including a reflective photomask and a protection structure at a backside of the photomask according to an embodiment.

In the following detailed description, reference is made to the accompanying drawings, which form a part hereof and in which are shown by way of illustrations specific embodiments in which a reflective photomask, a method of manufacturing a reflective photomask and a method of manufacturing a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

Furthermore, the term "on" is not to be construed as meaning only "directly on". Rather, if one element is positioned "on" another element, e.g., if a layer is "on" another layer or "on" a substrate, a further component, e.g., a further layer may be positioned between the two elements. For example, a further layer may be positioned between a layer and a substrate if the layer is "on" said substrate.

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

The terms metal and metallic as used in the context of this application do not include semi-metals. In particular, the terms metal and metallic do not include the elements boron, silicon, germanium, arsenic, antimony and/or tellurium. A metal structure includes at least a metallic portion and may include, in addition to the metallic portion, a further portion or further portions from non-metallic material or from semi-metallic material. Transition metals are the chemical elements with the atomic numbers 21 to 30, 39 to 48, 57 to 80 and 89 to 112.

According to an embodiment a photomask assembly includes a reflective photomask and a protection structure. The reflective photomask may include a substrate and a reflective multilayer on a first substrate surface of the substrate, wherein the multilayer is formed at the front side of the photomask. The protection structure is provided on a second substrate surface of the substrate at a backside of the photomask and may be detachable from the photomask at a temperature below 150° C.

The substrate may include a substrate main portion from an LTE (low thermal expansion) material with a coefficient of thermal expansion less than 1 ppm/K. In addition to the substrate main portion, the substrate may include one or more further layers at the side of the substrate main portion oriented to the reflective multilayer and/or one or more further layers at the side of the substrate main portion averted from the reflective multilayer.

The reflective multilayer may include a plurality of layer pairs, wherein each layer pair includes a first layer and a second layer. The first layers have a first refractive index and the second layers have a second refractive index at the exposure wavelength. The different indexes of reflection of the first and second layers result in that the reflective multilayer is effective as a Bragg reflector with a maximum of reflection typically at or close to an exposure wavelength for EUV or BEUV (beyond EUV). For example, the exposure wavelength may be 13.5 nm or 6.7 nm. The reflective multilayer may include one or more further layers at the side oriented to the substrate and/or at the side averted from the substrate.

The photomask may further include an unpatterned, continuous absorber layer stack or a patterned absorber layer stack on the reflective multilayer, wherein the patterned absorber layer stack forms an absorber pattern that may have openings exposing portions of the reflective multilayer. The absorber layer stack may include at least an absorbing layer with an absorbance of at least 40% at the exposure wavelength, e.g., at 13.5 nm or at 6.7 nm. The absorber layer stack may include one or more further layers at the side oriented to the reflective multilayer and/or at the side averted from the reflective multilayer.

The protection structure may be a flexible tape or a rigid plate that includes at least one of a glass, a metal, a semiconductor material, e.g., crystalline or polycrystalline silicon, a ceramic, a sintered material and a rigid resist. The protection structure may cover the complete second substrate surface. Outer surfaces of the protection structure and the photomask may be flush. Alternatively, the protection structure may laterally project beyond the outline of the photomask.

The protection structure may be bonded to the substrate. The bond between the protection structure and the substrate may be an adhesive bond or a glueless bond. For example, the protection structure and the photomask may be direct-bonded. Adhesion between directly bonded protection structure and photomask may be based on chemical bonds, hydrogen bonds, metallic bonds, ionic and/or covalent bonds between the substrate and the protection structure. Direct bonding may include exerting a moderate mechanical force that presses the protection structure and the photomask against each other, a thermal treatment of at least one of the two bonding surfaces at moderate temperature below 100° C., e.g., 120° C. or a combination of both, e.g. fusion bonding, thermo-compressive bonding, bonding by atomic rearrangement.

The protection structure is detachable from the photomask at a temperature below a boundary temperature at which atoms in the mask stack, e.g. in the reflective multilayer, start to diffuse across layer interfaces into neighboring layers to a more than negligible degree. For example, the protection structure may be detachable at a temperature below 150 degree Celsius, e.g., at most 135 degree Celsius or at most 120 degree Celsius. Detaching may include debonding a bond between the protection structure and the photomask. Detaching the protection structure may further include a cleaning of the second substrate surface with a rinsing fluid that is inert to the materials of the absorber layer stack and the reflective multilayer. For example, the rinsing fluid includes a liquid, a gas, or both.

A protection structure that can be debonded from the photomask at temperatures below 150° C. can be easily disassembled from the reflective photomask without adverse impact on the photomask, in particular, without negative impact on the absorber pattern, the reflective multilayer and/or the second substrate surface.

In particular, the protection structure can be removed in a way that none of the absorber pattern, the reflective multilayer and the substrate is affected to a more than negligible degree and without that non-negligible residues are left on the second substrate surface.

In other words, after removal of the protection structure, the second substrate surface can still fulfill the general specifications for EUV mask backsides as regards flatness and planarity. In particular, the protection structure leaves no residual particles that protrude more than 10 μm from the second substrate surface. In addition, after removal of the protection structure, dimensions of the absorber pattern and the multilayer fulfill the general specifications for the absorber pattern and the multilayer as well as specific specifications for a certain mask layout.

The protection structure may be removed prior to installing the reflective photomask in an EUVL apparatus or prior to shipping the photomask to a semiconductor factory.

The protection structure may temporarily protect the photomask against particle contamination during processes applied to the front side of the photomask, for example, during deposition of the reflective multilayer, during deposition of the absorber layer stack and/or during patterning of the absorber layer stack or during formation of a frame trench. Removal of the protection layer includes removal of particles deposited on the backside of the photomask prior to and/or during front side processing of the reflective photomask. Even particles deposited prior to applying the protection structure, which have not been completely removed by previous rinsing processes but which remain adhered to the protection layer, may be removed together with the protection structure.

In addition, the protection structure may avoid a direct contact between mask handling tools and the photomask backside and in this way may protect the backside of reflective photomasks against mechanical damage, for example, against scratches.

The protection structure may be provided with tools and methods known from semiconductor wafer technology. For example, the protection structure may include a rigid carrier or a flexible tape of the sort that is temporarily fixed onto semiconductor wafers during wafer thinning, wafer grinding, wafer dicing, and/or wafer probing.

According to an embodiment the substrate may include a backside film that may form the second substrate surface. The backside film may be an electrically conductive film that facilitates electrostatic chucking of the reflective photomask in an EUVL apparatus. For example, the backside film may include chromium (Cr) and nitrogen (N) or may include tantalum (Ta) and boron (B). The protection structure may be bonded directly on the backside film. Electrostatic chucking, e.g., on a nail-bed chuck may alleviate adverse impact of backside unevenness and/or roughness. Alternatively, the protection structure may be directly formed on the substrate main portion from an LTE material.

According to an embodiment, the protection structure may be detachable, e.g., debondable from the photomask by applying a temperature between 110° C. and 150° C., by applying electromagnetic radiation, by applying a de-bonding fluid that releases the bond and/or by applying moderate mechanical force. Moderate mechanical force is to be understood as a mechanical force sufficiently weak such that is not destructive for the photomask. Moderate mechanical force may be in the range of hand force applicable by men or lower.

For example, a heating treatment may debond, i.e., completely release or weaken by at least 90% the bond between the protection structure and the photomask. For example, a stream of hot air may be directed to the backside of the photomask assembly and the protection structure may be mechanically peeled off during/after thermal release/weakening of the bond. With a debonding temperature greater than 110° C., it is possible that the protection structure remains reliably fixed to the photomask during front side processing of the photomask, e.g., during all processes that pattern the absorber layer stack. With a debonding temperature below 150° C., e.g., at most 135° C. or at most 120° C. the debonding process does not affect the front side of the photomask, e.g., the absorber pattern.

Alternatively or in addition, the bond between photomask and protection structure may be completely released or weakened by at least 90% through irradiation of the protection structure with electromagnetic radiation of a certain wavelength range, for example, with ultraviolet light (UV-light).

Alternatively or in addition, the bond between photomask and protection structure may be completely released or weakened by at least 90% through application of a suitable de-bonding fluid, e.g., a fluid containing a solvent for the bond.

According to an embodiment the protection structure may include a main carrier and an adhesive layer that reversibly bonds the main carrier to the reflective photomask.

In general, releasing a reversible bond leaves the reversibly bonded structures unharmed. More specifically, releasing the reversibly bonded main carrier from the photomask leaves both the photomask and the main carrier intact. A photomask, which fulfills predefined requirements prior to releasing the reversible bond, will fulfill the same requirements after releasing the reversible bond, if applicable, at least after a further cleaning step. A main carrier released from the reversible bond may be reused for the same purpose without functional restrictions, if applicable, at least after a further cleaning step.

The main carrier may be rigid carrier from a solid material, e.g., a continuous, unpatterned plate or a plate with indentations, wherein the indentations may expose portions of the second substrate surface. For example, the main carrier may have the shape of a framed grid or may be a frame formed along the edge of the photomask.

The adhesive layer may include a glue applied on a mounting surface of the main carrier, on the second substrate surface, or on both prior to bonding the main carrier onto the second substrate surface. Alternatively, the adhesive layer may be an adhesive foil inserted between the main carrier and the second substrate surface prior to bonding the main carrier onto the second surface.

The rigid main carrier may be reused, if applicable, after a further cleaning process that removes residues of the adhesive layer. With a reusable main carrier it is possible to use comparatively expensive protection structures without drastically increasing costs. Residue-free glues and adhesive foils are proved and tested in processes applied to semiconductor wafers in the context of wafer backgrinding, wafer dicing and/or wafer probing.

According to an embodiment the protection structure may include a carrier tape and an adhesive layer that bonds the carrier tape to the photomask. The carrier tape may be any of the tapes used in semiconductor fabrication for temporarily stabilizing a semiconductor wafer, e.g., during grinding, dicing and/or probing. Alternatively, the carrier tape may be any of the tapes used as pick-up tape.

For example, the protection structure is an UV tape which has a strong adhesive strength directly after bonding. The UV tape covers the photomask backside during at least some of the front side processes. By irradiation with UV light, the adhesive strength decreases by at least 90% and the photomask can be easily removed from the UV tape after UV irradiation.

According to an embodiment, the photomask mask assembly may include a mechanical adaptor that includes a reception port suitable for supporting the reflective photomask. An outline of the mechanical adaptor corresponds to a standard wafer outline. For example, the outline of the mechanical adaptor may correspond to a standard wafer outline with a diameter of 200 mm or 300 mm. The mechanical adaptor facilitates the use of tools, which bond rigid main carriers and/or carrier tapes to semiconductor wafers, for bonding such carriers on reflective photomasks. For example, the mechanical adaptor may facilitate the application of a backgrinding tape or a pick-up tape on the second substrate surface of the photomask in a laminator tool as it is typically used for laminating semiconductor wafers with a backgrinding tape, dicing tape or pick-up tape.

According to an embodiment a method of manufacturing a reflective photomask may include forming a reflective photomask that includes a substrate, a reflective multilayer on a first substrate surface of the substrate, and an absorber pattern on the multilayer at a front side of the photomask. Before patterning the absorber pattern, a protection structure may be bonded onto a second substrate surface at a backside of the photomask.

Bonding of the protection structure to the photomask allows a debonding of the protection structure and, as a consequence, a temporary protection of the backside of the photomask without adverse impact on the photomask.

According to an embodiment, the protection structure may be detachable from the photomask at a temperature below 150° C., wherein detaching the protection structure from the photomask may include a debonding of the bond between the protection structure and the photomask and wherein debonding may include a complete release of the bond or a weakening of the bond by at least 90% combined with a mechanical peel-off. With a debonding temperature below 150° C., e.g., at most 135° C. or at most 120° C., the debonding process does not affect the front side of the photomask, e.g., the absorber pattern.

The protection structure may be provided before the reflective multilayer is formed, wherein the protection structure may avoid particle contamination on the second substrate surface during and between all relevant deposition processes. Alternatively, the protection structure may be provided after forming the reflective multilayer and prior to depositing an absorber layer stack from which the absorber pattern is formed, wherein the protection structure may avoid particle contamination on the second substrate surface during and between all processes applied for forming the absorber pattern.

According to an embodiment, the protection structure may be detached from the photomask after formation of the absorber pattern. The protection structure provides temporary protection of the photomask backside without affecting the use of the photomask in an EUVL apparatus.

According to another embodiment a photomask assembly may include a reflective photomask and a protection structure. The reflective photomask may include a substrate, a reflective multilayer on a first substrate surface of the substrate and an absorber pattern on the multilayer, wherein the multilayer and the absorber pattern are formed at the front side of the photomask. The protection structure is provided on a second substrate surface of the substrate at a backside of the photomask and is removable from the photomask at a temperature below 150° C. and/or by applying a process liquid that is inert at least to the absorber pattern. The process liquid may also be inert to the reflective multilayer and/or the substrate. The process liquid may contain a solvent based fluid.

A protection structure that can be removed at temperatures below 150° C. and/or by applying a process liquid that is inert to the absorber pattern can provide temporary protection of the photomask against backside contamination and/or against defects by mechanical contact with mask handling tools. It is possible that the temporary protection has no adverse impact on the use of the photomask in an EUVL apparatus, in particular, no negative impact on the absorber pattern, the reflective multilayer and/or the second substrate surface.

According to an embodiment the reflective photomask includes a backside film formed directly on the second substrate surface. The backside film may be an electrically conductive film that facilitates electrostatic chucking of the reflective photomask in an EUVL apparatus. For example, the backside film may include chromium (Cr) and nitrogen (N) or may include tantalum (Ta) and boron (B). The protection structure may be directly formed on the backside film. Electrostatic chucking on a nail-bed chuck may alleviate adverse impact of backside unevenness and/or roughness. Alternatively, the protection structure may be directly formed on the substrate main portion from the LTE material.

The protection structure may be removable chemically or physically, e.g., by grinding, CMP (chemical mechanical polishing), mechanical polishing or physical dry etching. For example, a protection structure based on an oxide and/or a silicon compound, e.g., $Si_3N_4$ or $Si_2O$ may be removed by RIE (reactive ion etching) or IBE (ion beam etching).

According to another embodiment the protection structure may be formed from a material that is completely dissolvable in a dissolver fluid.

For example, the protection structure may consist of one or more polymeric materials or may include one or more polymeric materials in addition to non-polymeric materials, wherein the dissolver fluid may be a liquid containing an organic solvent. The polymeric materials may include a polyimide or PTFE (polytetrafluoroethylene), by way of example.

According to another example, the protection structure may include at least one of a metal layer, an oxide layer and a layer from a silicon compound, wherein the dissolver fluid may include a liquid containing an acid. In case the photomask includes a metallic backside film, the dissolver fluid may include an etchant that removes the protection structure at high selectivity with respect to the backside film. For example, the protection structure may include at least one of a titanium (Ti) layer, an aluminum (Al) layer, a layer including titanium (Ti) and/or aluminum (Al), a silicon oxide layer like a silicon dioxide ($Si_2O$) layer formed using TEOS (tetraethoxysilane) as precursor material and a silicon nitride ($Si_3N_4$) layer.

According to another example, the dissolver fluid is an activated etch gas that dissolves a protection structure based on an oxide and/or a silicon compound, e.g., $Si_3N_4$ or $Si_2O$, in a plasma etch process.

According to an embodiment, the protection structure may be sprayed onto the second substrate surface, wherein the protection structure may be applied in a simple and cost-effective way. During fabrication of the photomask, requirements concerning backside planarity and/or backside flatness of the photomask and of the protection structure are comparatively relaxed and therefore can be fulfilled by cost-effective spray methods.

A further embodiment of the present disclosure refers to another method of forming a reflective photomask. A photomask is provided that may include a substrate, a reflective multilayer on a first substrate surface of the substrate at a front side of the photomask. Before forming an absorber pattern on the multilayer, a protection structure is provided on a second substrate surface of the substrate at a backside of the photomask. After forming the absorber pattern, the protection structure can be removed. The protection structure provides effective temporary protection of the photomask backside against particle contamination and mechanical defects caused by, e.g., mask handling tools.

According to an embodiment, the protection structure may be removed from the photomask at a temperature of at most 150 degree and/or by applying a process liquid inert to the absorber pattern. The protection structure may be applied and removed in an easy and cost-effective way.

According to another embodiment, the protection structure may be detached from the photomask, wherein application and removal of the protection structure may use processes proved and tested in combination with grinding, dicing and/or probing of semiconductor wafers or for pick-up processes.

Figure 1B:
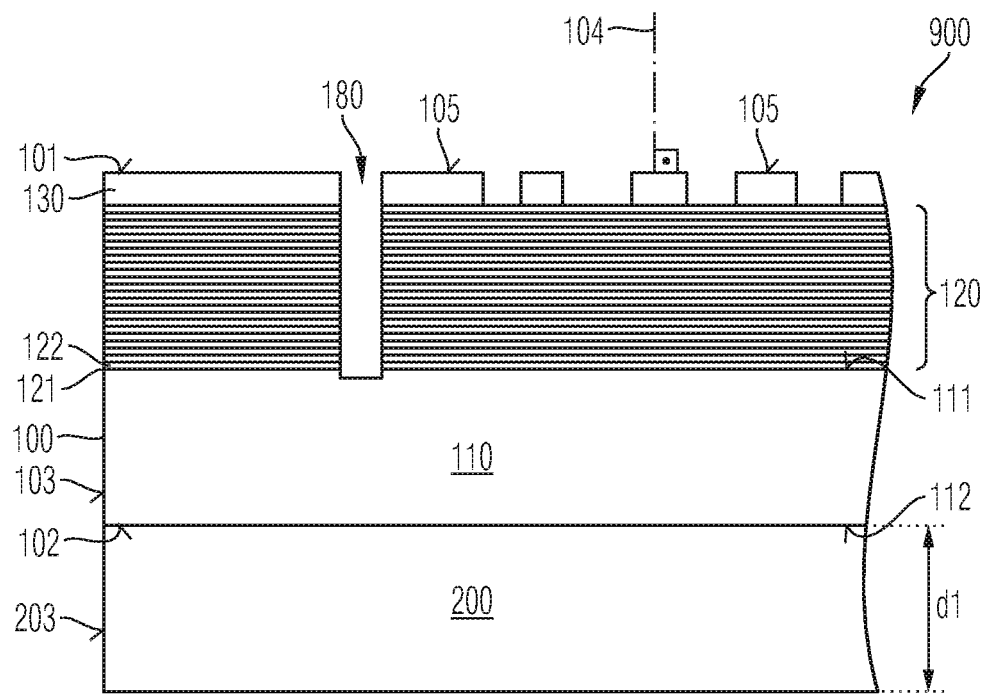

FIGS. 1A-1B shows a photomask assembly 900 with a reflective photomask 100 and a protection structure 200 for an exposure wavelength in a range from 1 nm to 15 nm. For example, the photomask 100 may be an EUVL mask for an exposure wavelength of about 13.5 nm. According to another embodiment the photomask 100 may be a BEUVL (beyond extreme ultraviolet lithography) mask for an exposure wavelength in a range to from 1 nm to 10 nm, e.g. about 6.7 nm.

The photomask 100 may have an approximately rectangular shape with an edge length of several centimeters. A pattern section 191 of the photomask 100 includes the image to be projected onto a semiconductor wafer, wherein the pattern section 191 includes the image information of one single semiconductor device or of a plurality of semiconductor devices. A frame section 192 may laterally surround the pattern section 191. The frame section 191 does not include image information about semiconductor devices. The frame section 191 may include a frame trench 180 extending from a first main surface 101 into the photomask 100.

During exposure of a semiconductor wafer in an EUVL apparatus, the photomask 200 is fixed on a mask stage, wherein the photomask 200 may be chucked with a second main surface 102 at the backside of the photomask 200 on the mask stage. The exposure radiation impinges onto the first main surface 101 at the front side of the photomask 200. The portion of the exposure radiation reflected at the first main surface 101 encodes the image information that is projected into a photoresist layer, which covers the semiconductor wafer during exposure.

The second main surface 102 at the backside of the photomask 100 is planar and flat. Directions parallel to the second main surface 102 are lateral directions. The first main surface 101 may include surface sections 105 parallel to the second main surface 102. A surface normal 104 to the surface sections 105 parallel to the second main surface 102 defines a vertical direction.

The photomask 100 includes a substrate 110 that includes at least a substrate main portion from an LTE material. The substrate 110 may include further layers, e.g., a backside film at the backside of the LTE material. A second substrate surface 112 of the substrate 110 forms the second main surface 102 of the photomask 100.

A reflective multilayer 120 is formed at a first substrate surface 111 at the front side of the substrate 110. The reflective multilayer 120 may include a plurality of layer pairs, wherein each layer pair includes a first layer 121 and a second layer 122. The first and the second layers have different refractive indices. For example, the first layers 121 may be molybdenum (Mo) layers with a thickness in a range from 2 nm and 5 nm and the second layers 122 may be silicon (Si) layers with a thickness in a range from 2 nm and 5 nm. The number of layer pairs may be between 20 and 70. The different indices of reflection of the first and second layers 121, 122 result in that the reflective multilayer 120 is effective as Bragg reflector with a maximum of reflection at a predefined exposure wavelength of, e.g., 13.5 nm or 6.7 nm. A minimum reflectance of the reflective multilayer 120 at the exposure wavelength is at least 50%, for example, greater than 60%.

An absorber pattern 130 is formed on the reflective multilayer 120 at a side averted from the substrate 110 such that the reflective multilayer 120 is between the absorber pattern 130 and the substrate 110. The absorber pattern 130 may have an absorbance of at least 50% at the exposure wavelength. A thickness of the absorber pattern 130 may be in a range from 10 nm to 90 nm. The absorber pattern 130 may be formed from an absorber layer stack that includes at least an absorber layer, wherein the absorber layer may be based on a metal nitride, for example, a transition metal nitride like tantalum nitride (TaN) or titanium nitride (TiN). For example, the absorber layer may be based on a tantalum nitride that may contain further main constituents, for example, boron (B) or oxygen (O), wherein the absorber layer is a tantalum boron nitride (TaBN) layer or a tantalum boron oxide (TaNO) layer. Alternatively, the absorber layer may contain chromium (Cr). For example, the absorber layer may consist of or contain chromium nitride (CrN). The frame trench 180 may extend through the reflective multilayer 120 to or into the substrate 110.

A protection structure 200 is provided at the backside of the photomask 100. The protection structure 200 may be directly formed, e.g., deposited on the second substrate surface 112 or may be bonded onto the second substrate surface 112. A lateral surface 203 of the protection structure 200 may be flush with a lateral surface 103 of the photomask 100. A thickness d1 of the protection structure 200 may be in a range from 50 µm to 2000 µm, e.g. from 80 µm to 1000 m if the protection structure 200 is bonded to the photomask 100 and may be in a range from 0.1 µm to 30 µm if the protection structure 200 is directly formed, e.g., deposited on the photomask 100.

The protection structure 200 may include one single layer or at least two different structures, for example, a rigid carrier or a flexible tape and an adhesive layer that adheres the rigid carrier or flexible tape to the photomask 100.

Figure 2A:
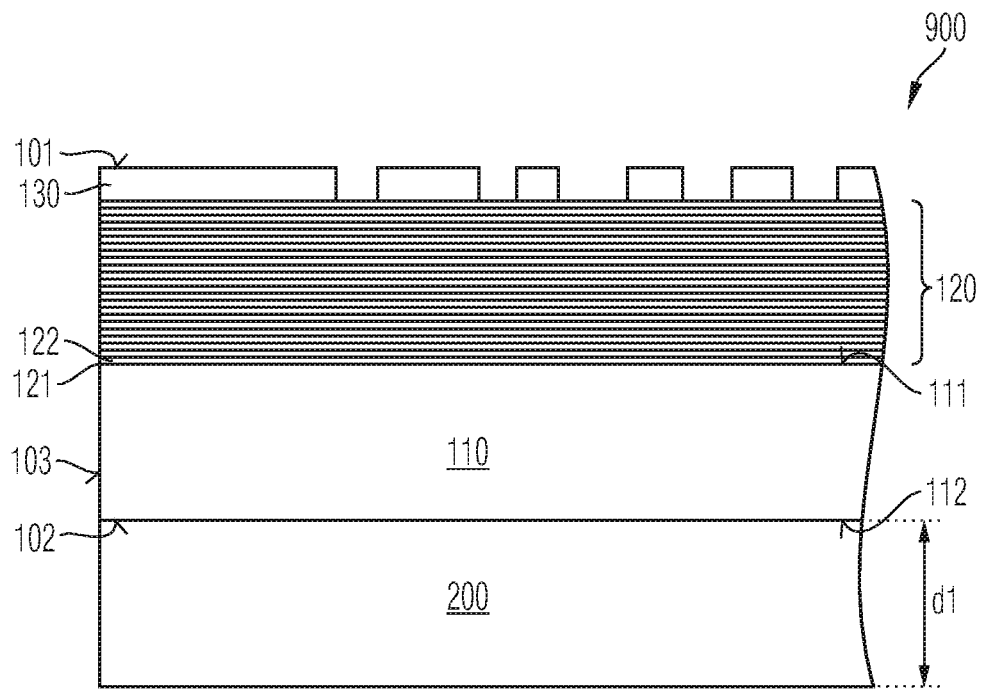
FIGS. 2A-2B illustrate schematic vertical cross-sectional views of photomask assemblies including a reflective photomask and a protection structure at a backside of the photomask according to other embodiments.

FIG. 2A shows a photomask assembly 900 with absorber pattern 130 and without a frame trench.

Figure 2B:
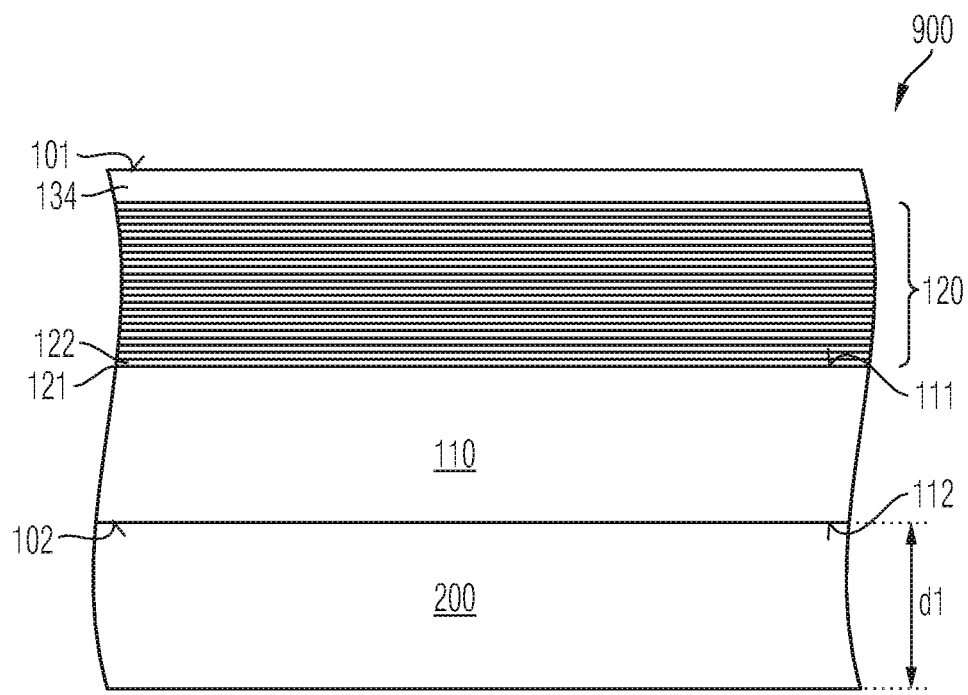

The photomask assembly 900 of FIG. 2B includes a photomask 100 with unpatterned absorber layer stack 134. In other words, the photomask 100 represents a mask blank in a state prior to forming an absorber pattern by patterning the absorber layer stack 134.

Figure 3A:
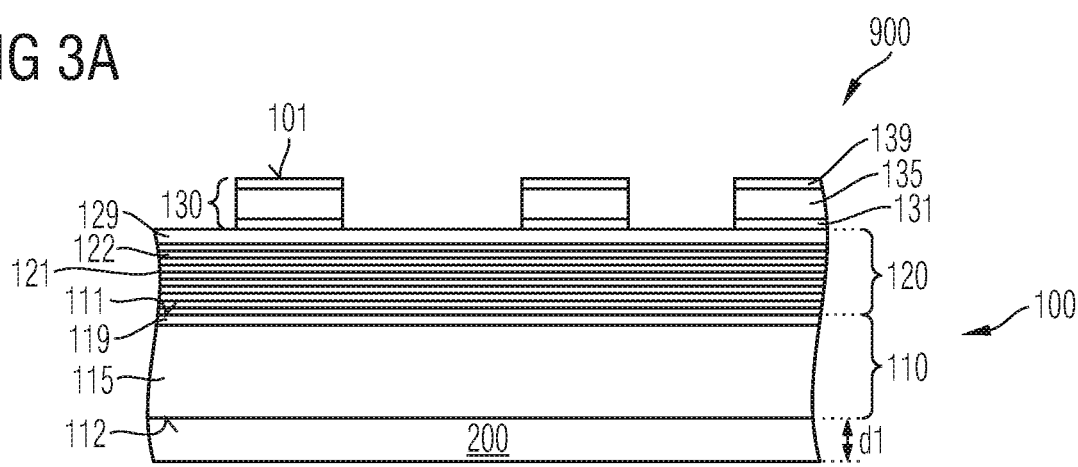
FIGS. 3A-3C illustrate schematic vertical cross-sectional views of photomask assemblies with reflective photomasks without electrically conductive backside film.
Figure 3B:
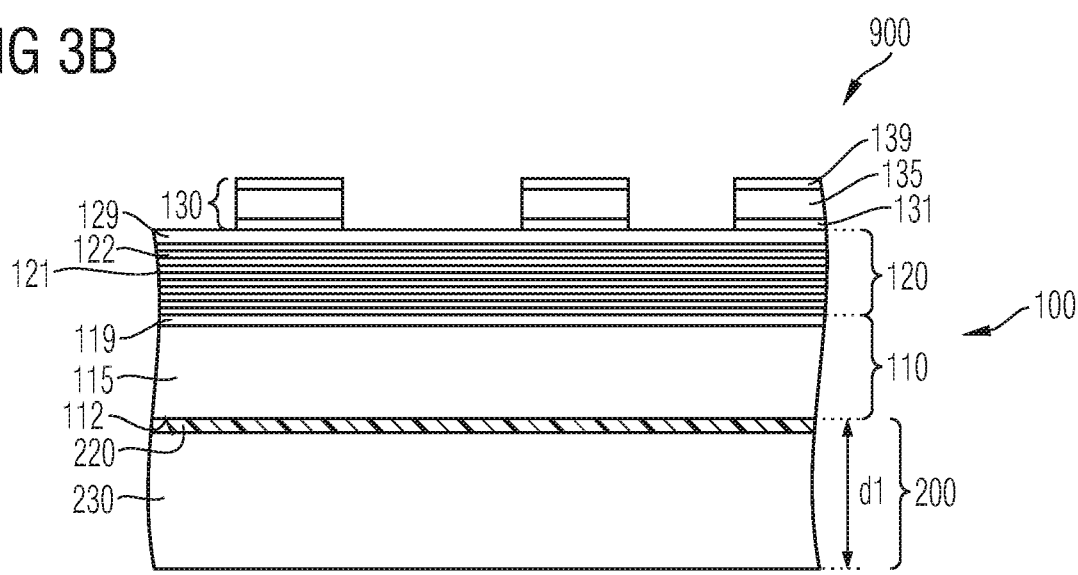
Figure 3C:
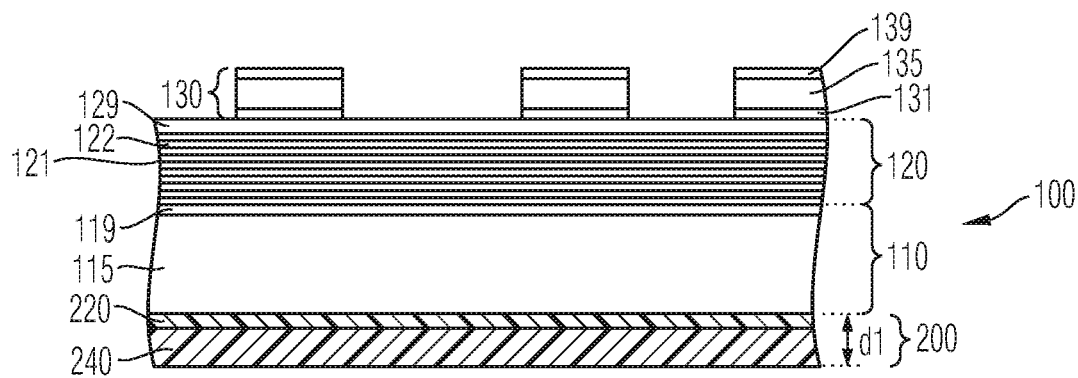

FIGS. 3A-3C refer to photomasks 100 without backside film, wherein in all figures the protection structure 200 is formed directly on a surface of a substrate main portion 115 from an LTE material.

The absorber pattern 130 is formed from an absorber layer stack that includes an absorber layer 135 and a buffer layer 131 formed between the absorber layer 135 and the reflective multilayer 120, wherein the buffer layer 131 may be effective as an etch stop layer during formation of the absorber pattern. Alternatively or in addition to the buffer layer 131, the absorber layer stack may include an anti-reflective layer 139 at the front side of the absorber layer 135.

At an inspection wavelength, which is typically longer than the EUV inspection wavelength, the anti-reflective layer 139 is less reflective than the absorber layer 135. The anti-reflective layer 139 may contain or may consist of a metal nitride, for example a transition metal nitride such as titanium nitride or tantalum nitride and may contain one or more further components selected from a group include chlorine, fluorine, argon, hydrogen or oxygen. The anti-reflective layer 139 may be formed by a treatment of a surface of the absorber layer 135 in an ambient containing the further component or precursors thereof. According to another embodiment, the anti-reflective layer 139 may be a silicon nitride layer or may be formed from tantalum oxide, which may contain further main constituents, for example boron, or may be a material containing chromium, for example, a chromium oxide CrO.

The reflective multilayer 120 may include a capping layer 129 at a side averted from the substrate 110. The capping layer 129 may be layer consisting of or containing ruthenium (Ru). The thickness of the capping layer 129 may be in a range from about 2 nm to 4 nm. The capping layer 129 may protect the multilayer 120 during fabrication of the absorber pattern 130. According to another embodiment, the capping layer 129 may be a titanium oxide (TiO) layer.

The substrate 110 may include a conductive interface layer 119 between the reflective multilayer 120 and the substrate main portion 115. The conductive interface layer 119 may be a metal film containing or consisting of tantalum (Ta) or chromium (Cr), by way of example. The conductive interface layer 119 may at least locally connect a portion of the multilayer 120 in the pattern section 191 with the frame section 192 and may prevent a charge-up of the pattern section 211 during exposure such that exposure is not affected by electrostatic charge.

The frame trench 180 may extend down to an upper edge of the conductive interface layer 119, may extend into the conductive interface layer 119 or may partially perforate the conductive interface layer 119, wherein residues of the conductive interface layer 119 may form bridges between the pattern section 191 and the frame section 192.

In FIG. 3A the protection structure 200 is a single layer directly bonded or deposited onto a surface of the substrate main portion 115. Adhesion between a directly bonded protection structure 200 and the substrate main portion 115 may be based on chemical bonds, hydrogen bonds, metallic bonds, ionic and/or covalent bonds between the substrate main portion 115 and the protection structure 200. Direct bonding may include exerting a moderate mechanical force, which presses the protection structure 200 and the photomask 100 against each other, a thermal treatment of at least one of the two bonding surfaces at moderate temperature below 120° C., e.g., below 100° C., or a combination of both, e.g., fusion bonding, thermo-compressive bonding or bonding by atomic rearrangement. Direct bonding may include the absence of any additional intermediate layer, in particular, the absence of adhesives containing a resin.

Alternatively, the protection structure 120 may be deposited, e.g., sprayed onto the exposed surface of the substrate main portion 115, wherein formation of the protection structure 120 may include a bake of the sprayed protection structure 120 at moderate temperatures below 120° C., e.g., below 110° C. to drive off volatile matter.

In FIG. 3B the protection structure 200 includes a rigid main carrier 230 and an adhesive layer 220 that adheres the rigid main carrier 230 to the substrate main portion 115 of the reflective photomask 100. The main carrier 230 may include a plate or a frame that includes at least one of a glass, a metal, a semiconductor material, e.g., crystalline or polycrystalline silicon, a ceramic, a silicon oxide, a sintered material and a rigid resist.

The adhesive layer 220 reversibly bonds the main carrier 230 and the main substrate 110. For example, the adhesive layer 220 includes a glue, an adhesive film and/or an adhesive foil. The adhesive layer 220 may contain, for example, a polyacrylate.

In FIG. 3C the protection structure 200 includes a flexible carrier tape 240 and an adhesive layer 220 that reversibly bonds the flexible carrier tape 240 to the substrate main portion 115. The flexible carrier tape 240 may consist of or contain polyolefine, PET (polyethylene) or PVC (polyvinyl chloride), by way of example. A thickness of the flexible tape may be in a range from 60 µm to 100 µm, by way of example. The adhesive layer 220 may include an adhesive foil.

Figure 4A:
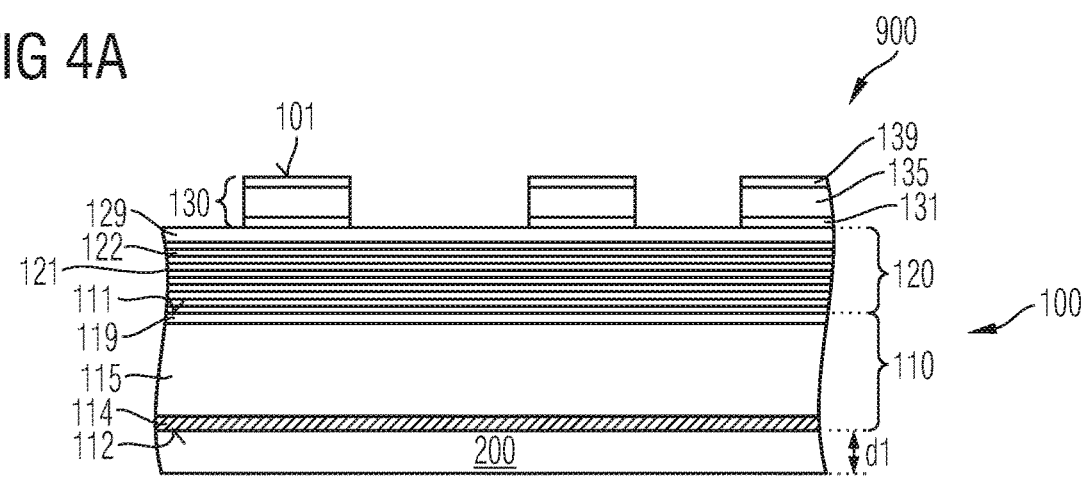
FIGS. 4A-4C illustrate schematic vertical cross-sectional views of photomask assemblies with reflective photomasks with electrically conductive backside film.
Figure 4B:
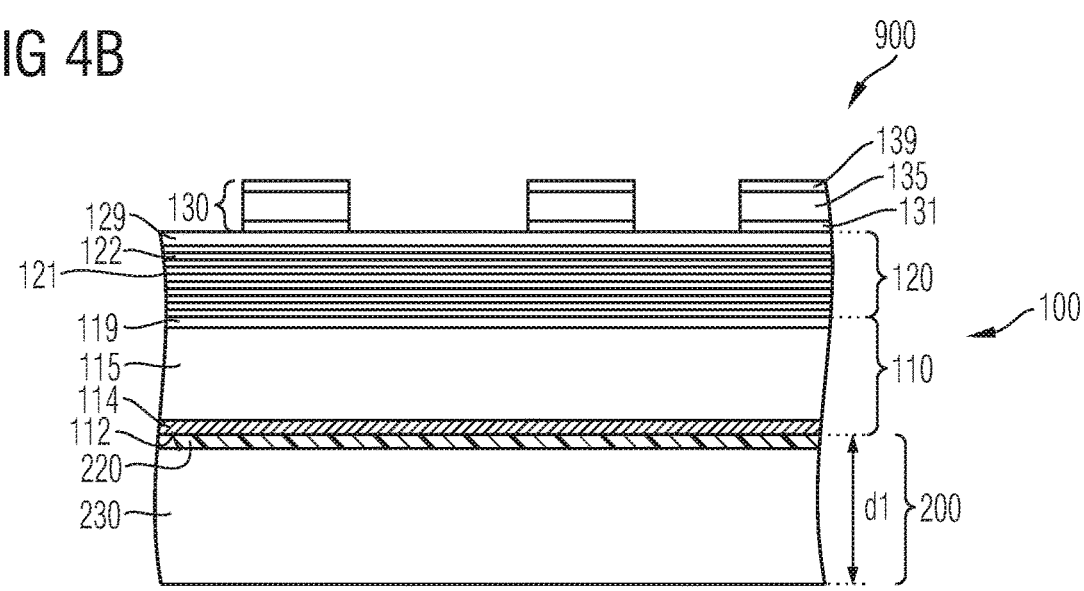
Figure 4C:
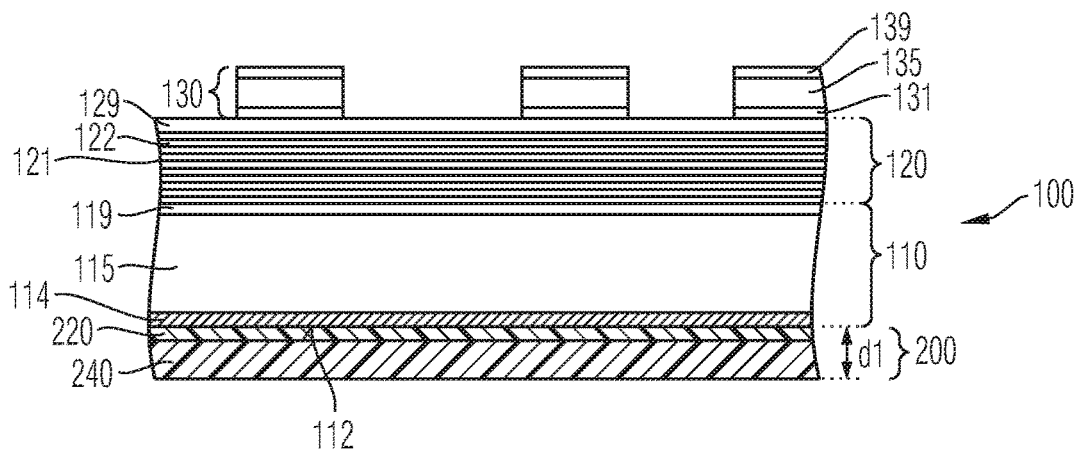

FIGS. 4A-4C refer to photomasks 100, which substrates 110 include backside films 114. The protection structures 200 are formed directly on a surface of the backside film 114. The backside films 114 may include a conductive layer, e.g., a CrN (chromium nitride) layer. As regards further details of the protection structures 200 and the photomasks 100, reference is made to the preceding description and the figures.

Figure 5A:
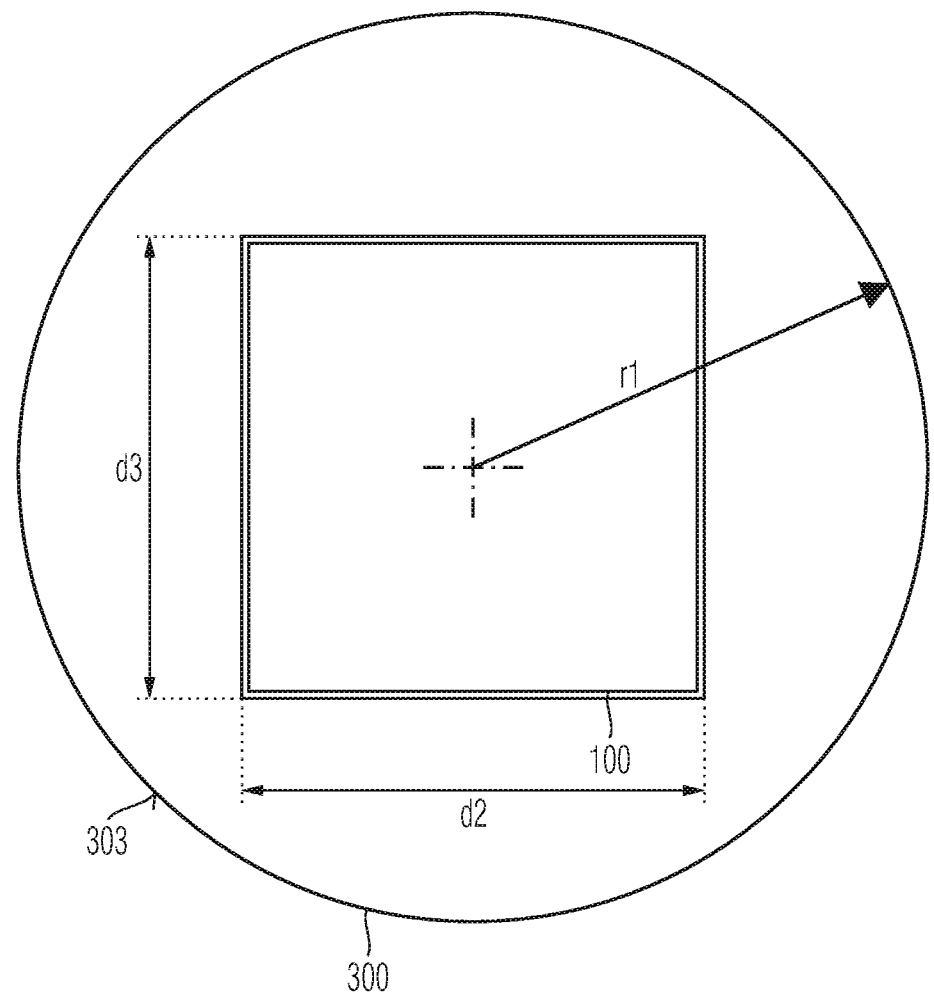
FIGS. 5A-5B illustrate a schematic plan view and a schematic cross-sectional view of a photomask assembly including an adaptor.
Figure 5B:
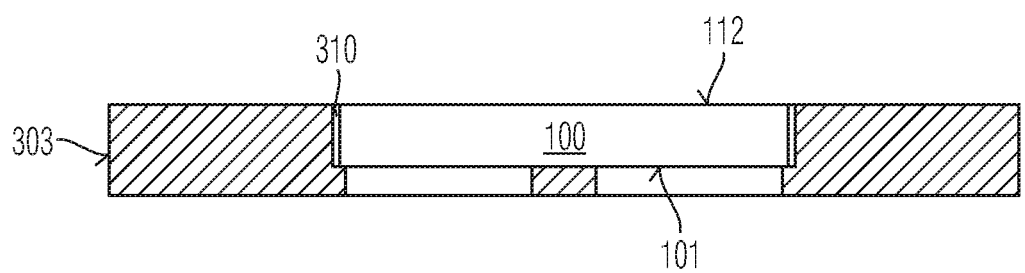

FIGS. 5A to 5B show a mechanical adaptor 300 with a rectangular reception port 310 suitable for supporting a reflective photomask 100. The reception port 310 may be a groove formed in a top surface of the mechanical adaptor 300. Lateral dimensions d2, d3 of the reception portion 310 may be equal to or marginally greater than the lateral dimensions of the photomask 100.

An outline 303 of the mechanical adaptor 300 may be equal to or approximates the outline of a standard semiconductor wafer For example, the mechanical adaptor 300 may be round with a radius r1 of 150 mm. For tools that are designed to apply temporary carriers, backgrinding tapes, dicing tapes or pick-up tapes to semiconductor wafers, for example, for a laminating tool, the mechanical adaptor 300 charged with a photomask 100 in the reception port 310 may emulate the presence of a semiconductor wafer.

FIGS. 6A to 6D illustrate the use of a protection structure 200 in a method of manufacturing a photomask 100, wherein a protection structure 200 is bonded to a photomask 100 at a stage of processing in which the photomask 100 is in the state of a mask blank with unpatterned absorber layer stack 134. Other embodiments may bond the protection structure 200 to the photomask 100 at an earlier stage of processing, e.g., prior to depositing the absorber layer stack 134, or prior to forming the reflective multilayer 120.

Figure 6A:
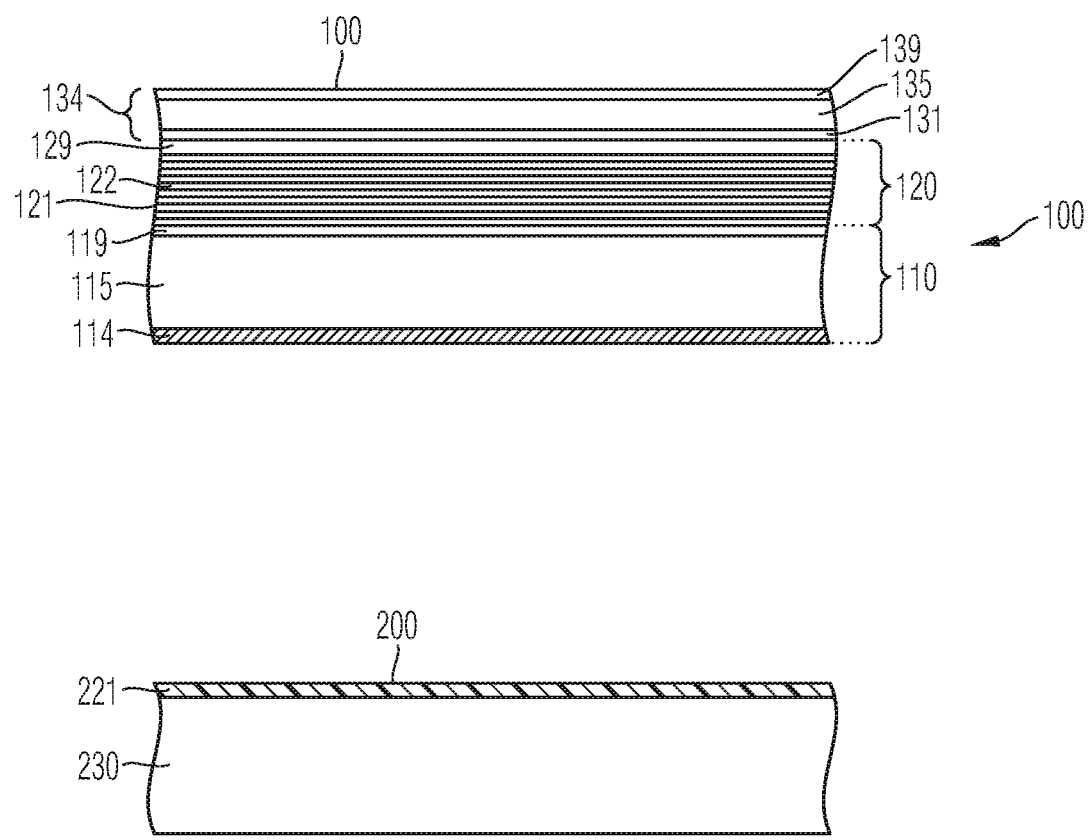
FIGS. 6A-6D are schematic vertical cross-sectional views of portions of a reflective photomask and a protection structure for illustrating a method of manufacturing a reflective photomask according to a further embodiment.

The upper half of FIG. 6A shows a photomask 100 with a substrate 110 that includes a backside film 114 formed on a surface at a backside of a substrate main portion 115. For further details of the photomask 100, reference is made to the description of the preceding figures. The lower half of FIG. 6A shows a protection structure 200 with a rigid main carrier 230. An adhesive 221 is applied on a top surface of the main carrier 230, e.g., by dripping or by attaching an adhesive foil. Alternatively, an adhesive may be applied on the exposed surface of the backside film 114 or on both the main carrier 230 and the backside film 114. The protection structure 200 and the photomask 100 are brought into contact with each other along the top surface of the main carrier 230 and along the exposed surface of the backside film 114.

Figure 6B:
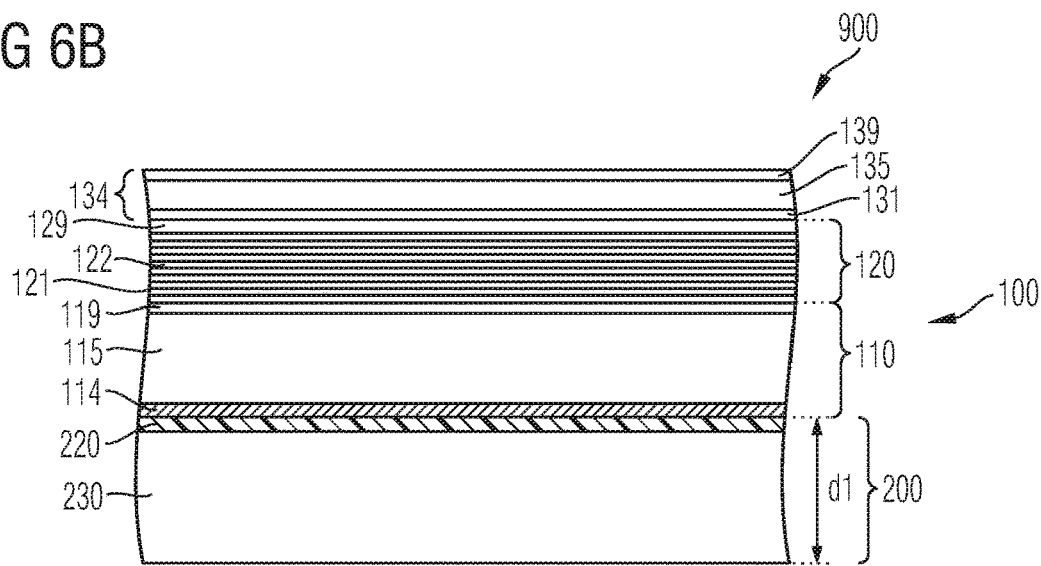

As shown in FIG. 6B, the adhesive 221 of FIG. 6A forms an adhesive layer 220 bonding the main carrier 230 to the photomask 100. The adhesive layer 220 and the main carrier 230 form a protection structure 200 for the backside of the photomask 100. The photomask 100 and the protection structure 200 form a photomask assembly 900 as described above. Processing at the front side of the photomask 100 may be continued, e.g., by patterning the absorber layer stack 134 and/or forming a frame trench.

Figure 6C:
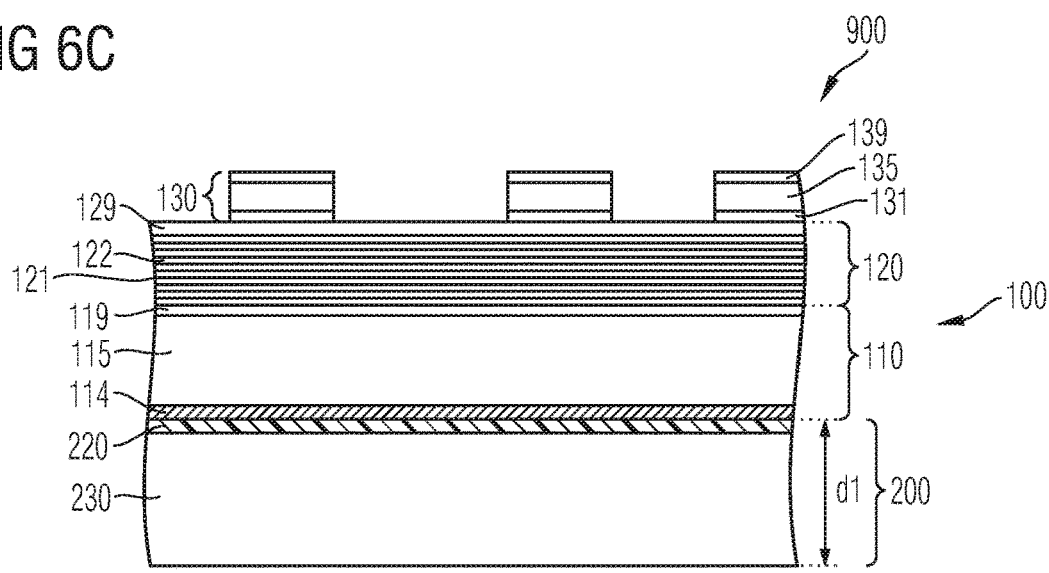

FIG. 6C shows an absorber pattern 130 formed from the absorber layer stack 134 of FIG. 6B. Then the protection structure 200 may be removed, by UV radiation and mechanical peel-off.

Figure 6D:
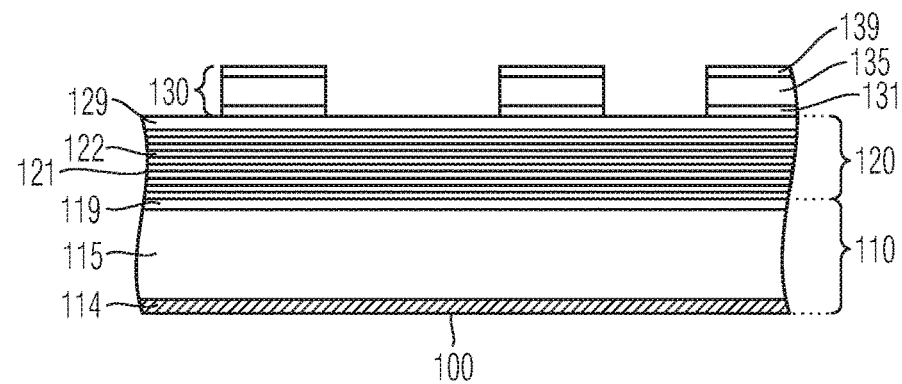

FIG. 6D shows the photomask 100 disassembled from the protection structure 200 of FIG. 6C.

A method of manufacturing a semiconductor device may include providing a reflective photomask that includes a substrate, a reflective multilayer on a first substrate surface of the substrate and an absorber pattern on the reflective multilayer at a front side of the photomask; providing a protection structure on a second substrate surface at a backside of the photomask; exposing, in an EUVL apparatus, a semiconductor with EUV light reflected at the reflective photomask charged with the protection structure; and removing, after exposing the semiconductor substrate, the protection structure. More than one exposure may be carried out and the photomask may be mounted in the EUVL apparatus more than one time before the protection structure is replaced. As regards details of the photomask and the protection structure, reference is made to the preceding parts of the description and the figures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A photomask mask assembly, comprising:
  a reflective photomask comprising a substrate that comprises a substrate main portion from an LTE (low thermal expansion) material;
  a reflective multilayer on a first substrate surface of the substrate at a front side of the reflective photomask; and
  a protection structure bonded directly on a second substrate surface of the substrate at a backside of the reflective photomask, wherein the protection structure is in direct contact with the substrate main portion, wherein the protection structure is in contact with the entire second substrate surface, wherein the protection structure and the substrate main portion are connected by chemical bonds such as hydrogen bonds, metallic bonds, ionic bonds, and/or covalent bonds, wherein the protection structure is detachable in one piece from the reflective photomask at a temperature below 150 degree Celsius, and wherein the protection structure comprises a rigid plate comprising at least one of a glass, crystalline silicon, polycrystalline silicon, a ceramic and a sintered material.

2. The photomask mask assembly of claim 1, wherein the protection structure is detachable from the reflective photomask by at least one of applying a temperature between 110 degree Celsius and 150 degree Celsius, applying electromagnetic radiation, applying a de-bonding fluid configured to release a bond between the reflective photomask and the protection structure, and applying mechanical force such that the photomask is not destroyed.

3. The photomask mask assembly of claim 1, further comprising:
  a mechanical adaptor comprising a reception port configured to support the reflective photomask, wherein an outline of the mechanical adaptor corresponds to a standard wafer outline with a diameter of 200 mm or 300 mm.

4. A photomask mask assembly, comprising:
  a reflective photomask comprising a substrate that comprises a substrate main portion from an LTE (low thermal expansion) material;
  a reflective multilayer on a first substrate surface of the substrate at a front side of the reflective photomask; and
  a protection structure bonded directly on a second substrate surface of the substrate at a backside of the reflective photomask, wherein the protection structure is in direct contact with the substrate main portion, wherein the protection structure is in contact with the entire second substrate surface, wherein the protection structure is detachable in one piece from the reflective photomask at a temperature below 150 degree Celsius, and wherein the protection structure comprises a rigid plate comprising a glass, crystalline silicon, polycrystalline silicon, a ceramic, and/or a sintered material,
  wherein the protection structure comprises a main carrier as the rigid plate and an adhesive layer, and wherein the adhesive layer bonds the main carrier to the reflective photomask.

5. A method of manufacturing a reflective photomask mask, the method comprising:
  forming a reflective photomask comprising a substrate, a reflective multilayer on a first substrate surface of the substrate, and an absorber pattern on the reflective multilayer at a front side of the reflective photomask, wherein the substrate comprises a substrate main portion from an LTE (low thermal expansion) material and an electrically conductive backside film forming a second substrate surface at a backside of the reflective photomask; and
  before the absorber pattern is formed, bonding a protection structure in one piece directly on the conductive backside film, wherein the protection structure is in contact with the entire second substrate surface, wherein bonding comprises adhesion bonding or direct-bonding, wherein direct-bonding comprises exerting a mechanical force that presses the protection structure and the photomask against each other, a thermal treatment of at least one of two bonding surfaces at a temperature below 120° C., or a combination of both, and wherein direct-bonding comprises forming chemical bonds such as hydrogen bonds, metallic bonds, ionic bonds, and/or covalent bonds between the protection structure and the conductive backside film.

6. The method of claim 5, wherein the protection structure is detachable from the reflective photomask at a temperature below 150 degree Celsius.

7. The method of claim 5, wherein the protection structure is bonded to the photomask before the reflective multilayer is formed.

8. The method of claim 5, wherein the protection structure is detached from the reflective photomask after the absorber pattern is formed.

9. A method of manufacturing a reflective photomask mask, the method comprising:
  forming a reflective photomask comprising a substrate, and a reflective multilayer on a first substrate surface of the substrate at a front side of the reflective photomask, wherein the substrate comprises a substrate main portion from an LTE (low thermal expansion) material forming a second substrate surface at a backside of the substrate;
  before forming an absorber pattern on the reflective multilayer, bonding a protection structure in one piece on the second substrate surface, wherein the protection structure is in contact with the entire second substrate surface, wherein the bonding comprises adhesion bonding or direct-bonding, wherein the direct-bonding comprises exerting a mechanical force that presses the protection structure and the photomask against each other, a thermal treatment of at least one of two bonding surfaces at a temperature below 120° C., or a combination of both, and wherein direct-bonding comprises forming chemical bonds such as hydrogen bonds, metallic bonds, ionic bonds, and/or covalent bonds between the protection structure and the conductive backside film; and detaching the protection structure from the second substrate surface in one piece after the absorber pattern is formed.

\* \* \* \* \*